United States Patent
Kim

(10) Patent No.: US 8,338,878 B2
(45) Date of Patent: Dec. 25, 2012

(54) FLASH MEMORY DEVICE WITH ISOLATION STRUCTURE

(75) Inventor: Ki Seog Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 313 days.

(21) Appl. No.: 12/323,657

(22) Filed: Nov. 26, 2008

(65) Prior Publication Data
US 2009/0173987 A1    Jul. 9, 2009

Related U.S. Application Data

(62) Division of application No. 11/479,525, filed on Jun. 30, 2006, now Pat. No. 7,470,587.

(30) Foreign Application Priority Data

Nov. 10, 2005  (KR) ................ 10-2005-0107426

(51) Int. Cl.
*H01L 29/788* (2006.01)

(52) U.S. Cl. .................. 257/316; 257/E29.3

(58) Field of Classification Search .............. 257/316, 257/E29.3
See application file for complete search history.

(56) References Cited

U.S. PATENT DOCUMENTS

| | | |
|---|---|---|
| 6,436,751 B1 | 8/2002 | Liou et al. |
| 2002/0012745 A1* | 1/2002 | Kanamori ............... 427/96 |
| 2002/0142544 A1* | 10/2002 | Wang ............... 438/257 |

FOREIGN PATENT DOCUMENTS

| | | |
|---|---|---|
| CN | 1532937 | 9/2004 |
| JP | 10-189917 | 7/1998 |
| JP | 2000-077632 | 3/2000 |
| JP | 2000-260887 | 9/2000 |
| JP | 2004-214621 | 7/2004 |
| KR | 10-2004-0051302 A | 6/2004 |

* cited by examiner

*Primary Examiner* — Lex Malsawma
(74) *Attorney, Agent, or Firm* — Kitpatrick Townsend & Stockton LLP

(57) ABSTRACT

A flash memory device includes trenches that are formed at regions on a semiconductor substrate spaced apart from one another at predetermined distances, buried floating gates buried into the trenches, a plurality of isolation structures formed between the buried floating gates, and a dielectric film and a control gate formed on the buried floating gates.

8 Claims, 7 Drawing Sheets

FLASH MEMORY DEVICE WITH ISOLATION STRUCTURE

CROSS REFERENCES TO RELATED APPLICATIONS

The present application is a division of U.S. patent application Ser. No. 11/479,525, filed on Jun. 30, 2006, now U.S. Pat. No. 7,470,587 which claims priority to Korean patent application number 10-2005-107426, filed on Nov. 10, 2005, which is incorporated by reference in its entirety.

BACKGROUND

The present invention relates to a method of manufacturing a flash memory device, and more particularly, to a flash memory device which can minimize the interference phenomenon between adjacent floating gates and a method of manufacturing the same.

Recently, in the manufacturing of flash memory devices, the spaces in which a unit active region and a unit field region will be formed are continuously being reduced as the level of integration is increased. As the dielectric film including the floating gate and the control gates are formed within the narrow active space, the inter-gate distance becomes narrow and the interference phenomenon becomes more problematic.

FIG. 1 is a cross-sectional view of a general flash memory device and illustrates a method of manufacturing a flash memory device to which self-aligned Shallow Trench Isolation (STI) is applied.

Referring to FIG. 1, a tunnel oxide film 11 and a first polysilicon film 12 are sequentially formed over a semiconductor substrate 10. The first polysilicon film 12 and the tunnel oxide film 11 are selectively etched by an etch process employing an isolation mask. The semiconductor substrate 10 is then etched using the first polysilicon film 12 as a mask, thus forming trenches.

An insulating film, such as a High Density Plasma (HDP) oxide film, is formed over the trenches and the first polysilicon film 12 on the entire structure so that the trenches are filled. The insulating film is polished by Chemical Mechanical Polishing (CMP) to expose the top surface of the first polysilicon film 12, thereby forming isolation structures 13 within the trenches.

A second polysilicon film 14 is formed over the isolation structures 13 and the first polysilicon film 12. The second polysilicon film 14 is etched using a mask to form a floating gate with both the first polysilicon film 12 and the second polysilicon film 14. A dielectric film 15 and a conductive film 16 are sequentially formed over the floating gate and the isolation structures 13 and are then patterned using a mask, forming control gates over the isolation structure 13.

However, as semiconductor devices continue to become more integrated, the width of the isolation structure is made smaller. Accordingly, the distance between adjacent first polysilicon films is also reduced, resulting in an interference phenomenon.

Furthermore, the threshold voltage (Vt) of the semiconductor substrate is changed due to the interference phenomenon between the floating gates. As the interference phenomenon increases in the direction of the control gates, device characteristics are inevitably degraded. The interference phenomenon lowers the program speed of the flash cell and results in degraded quality.

SUMMARY OF THE INVENTION

An embodiment of the present invention provides a flash memory device and a method of manufacturing in which buried floating gates are formed at portions of trenches for forming isolation structures and are isolated by the isolation structures, thereby avoiding the interference between the floating gates, and as the sidewalls of the trenches become channels of the flash memory device, the channel length becomes longer compared with the related art and reduce the cell leakage, the threshold voltage (Vt) can be minimized, and disturb effects can be reduced.

A flash memory device according to an embodiment of the present invention includes trenches that are formed on a semiconductor substrate spaced apart from one another at predetermined distances, buried floating gates buried into the trenches, a plurality of isolation structures formed between the buried floating gates, and a dielectric film and a control gate formed on the buried floating gates.

According to an embodiment of the present invention, a method of manufacturing a flash memory device includes performing high-concentration ion implantation on a semiconductor substrate, forming a first oxide film, a first polysilicon film, and a hard mask film over the semiconductor substrate and etching the stack film and predetermined regions of the semiconductor substrate to form a plurality of first trenches, forming a second oxide film on sidewalls of the first trenches, forming a second polysilicon film to bury the first trenches, oxidizing a portion of a top surface of the second polysilicon film to form a third oxide film, thereby forming a dielectric film, stripping the hard mask film, forming a conductive film, and patterning the conductive film to form control gates, and etching the exposed second polysilicon film using the control gates as a mask, thereby forming second trenches, and forming an insulating film to bury the second trenches, thereby forming isolation structures.

According to another embodiment of the present invention, a method of manufacturing a flash memory device includes performing high-concentration ion implantation on a semiconductor substrate, forming a first oxide film on the semiconductor substrate and etching the first oxide film and predetermined regions of the semiconductor substrate to form a plurality of first trenches, forming a second oxide film on sidewalls of the first trenches, forming a first polysilicon film to bury the first trenches, oxidizing a portion of a top surface of the first polysilicon film to form a third oxide film, thereby forming a dielectric film, forming a conductive film on the entire structure, and patterning the conductive film to form control gates, and etching the exposed first polysilicon film using the control gates as a mask, thereby forming second trenches, and forming an insulating film to bury the second trenches, thereby forming isolation structures.

DETAILED DESCRIPTION OF EMBODIMENTS

The present invention will now be described in detail in connection with certain embodiments with reference to the accompanying drawings.

FIGS. 2A to 2E are layout diagrams illustrating a flash memory device to which a self-aligned STI is applied according to a first embodiment of the present invention. FIGS. 3A to 3F are cross-sectional views of the flash memory devices corresponding to the layout diagrams of FIGS. 2A to 2E, respectively.

Figure 1:
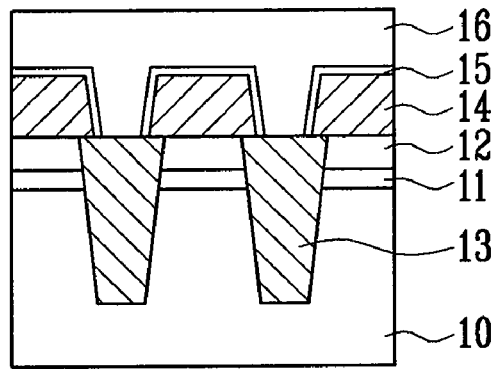
FIG. 1 is a cross-sectional view illustrating a method of manufacturing a flash memory device in the related art.
Figure 2A:
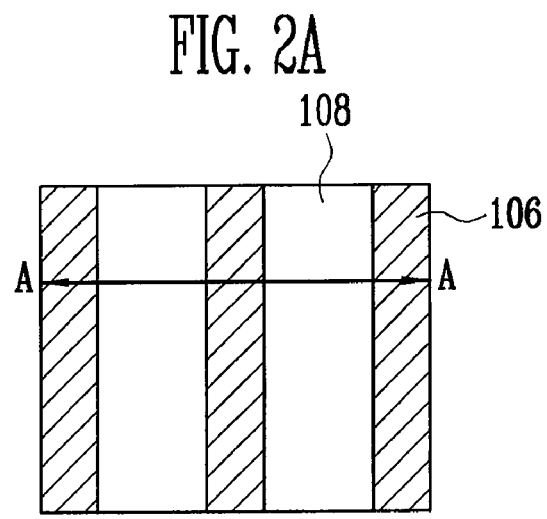
FIGS. 2A to 2E are layout diagrams illustrating a flash memory device to which a self-aligned STI is applied according to a first embodiment of the present invention.
Figure 3A:
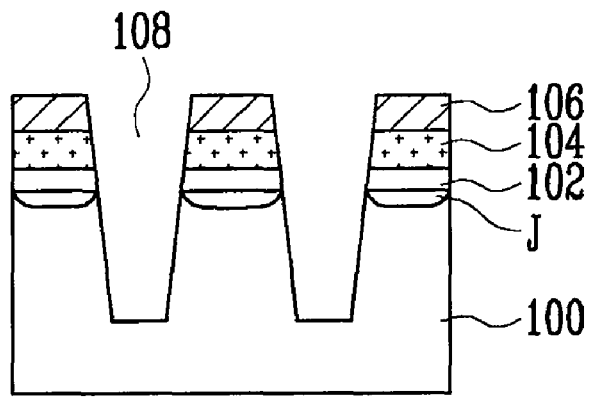
FIGS. 3A to 3F are cross-sectional views of the flash memory devices corresponding to the layout diagrams of FIGS. 2A to 2E, respectively.

FIG. 3A is a cross-sectional view of the flash memory device taken along line A-A in FIG. 2A. Referring to FIGS. 2A and 3A, a high concentration ion implantation process is performed to form a junction unit J on a semiconductor substrate 100. A first oxide film 102 is thickly formed on the semiconductor substrate 100. Since a high concentration of ions has been injected into the semiconductor substrate 100, the first oxide film 102 can be thickly formed using a low thermal process. The first oxide film 102 may be formed to a thickness of about 300 Å to about 500 Å.

A first polysilicon film 104 and a hard mask film 106 are sequentially formed on the first oxide film 102. The hard mask film 106, the first polysilicon film 104, the first oxide film 102, and the semiconductor substrate 100 are selectively etched using photolithography and etch processes employing an isolation mask, thereby forming a plurality of first trenches 108. The hard mask film 106 may be formed using a nitride film and the first polysilicon film 104 may be formed using a doped polysilicon film.

Figure 2B:
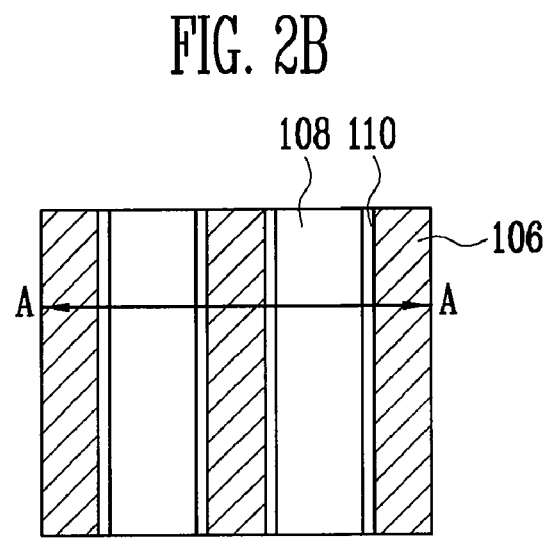
Figure 3B:
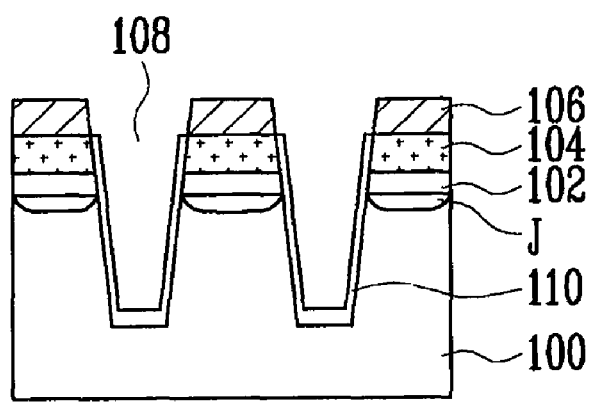

FIG. 3B is a cross-sectional view of the flash memory device taken along line A-A in FIG. 2B. Referring to FIGS. 2B and 3B, an ion implantation process for controlling the threshold voltage (Vt) is performed on the sidewalls of the first trenches 108. The junction units J are formed at both sides of the first trenches 108 and electrons can move along the sidewalls of the first trenches 108 making the sidewalls of the first trenches 108 the channel region of the device.

Therefore, the channel length can be made longer than that of the related art. In the case of a short channel length, the cell leakage is increased. To prevent this problem, a greater amount of positive ions are injected. However, this method increases the disturb effect and degrades product characteristics.

In the present invention, however, the channel length is very long. Accordingly, cell leakage can be prevented by injecting only a small amount of positive ions. It is therefore possible to minimize the cell threshold voltage (Vt). This also means that disturb effects of the NAND flash memory, which become worse as the channel concentration increases, are improved. Accordingly, product characteristics can be improved.

An oxidation process is then performed to form sidewall oxide films 110 within the first trenches 108. The sidewall oxide films 110 may be formed to a thickness of about 70 Å to 100 Å. When the sidewall oxide films 110 are formed, a portion of the first polysilicon film 104 is oxidized.

Figure 2C:
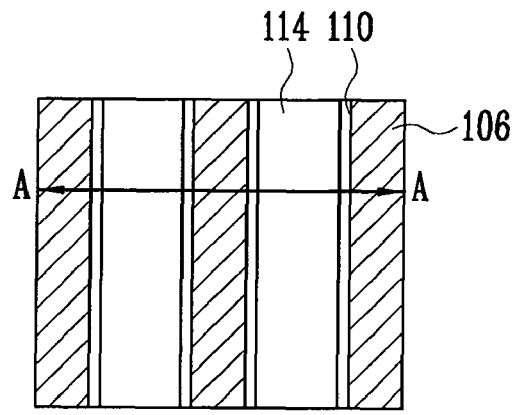
Figure 3C:
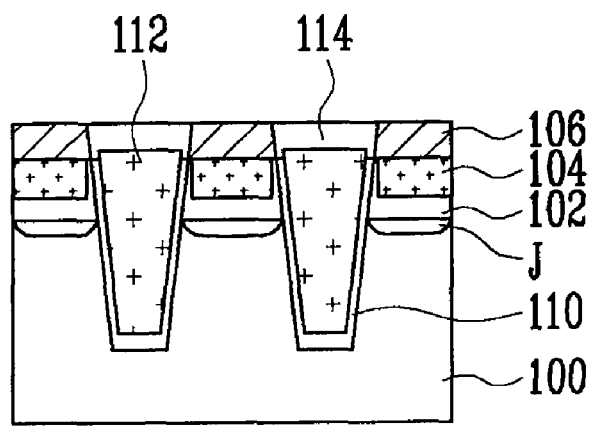

FIG. 3C is a cross-sectional view of the flash memory device taken along line A-A in FIG. 2C. Referring to FIGS. 2C and 3C, a second polysilicon film 112 is formed on the entire structure so that the first trenches 108 are buried. The second polysilicon film 112 is polished until the top surface of the nitride film 106 is exposed isolating each second polysilicon film 112.

The polishing process may be performed using CMP. By doing so, the second polysilicon films 112 buried within the first trenches 108 serve as floating gates, and the sidewall oxide films 110 serve as tunnel oxide films.

Thereafter, an oxidization process is performed on the top surfaces of the second polysilicon films 112, thereby forming second oxide films 114. While the second polysilicon films 112 are oxidized, a portion of the first polysilicon film 104 is oxidized, so that the thickness of the oxide film at the sidewalls of the first polysilicon film 104 becomes thicker.

The second oxide films 114 may be formed to a thickness of about 300 Å to about 500 Å on the first polysilicon film 104. The second oxide films 114 formed by the oxidization process serve as dielectric films between the floating gate of the flash memory device and control gates formed in a subsequent process.

Figure 2D:
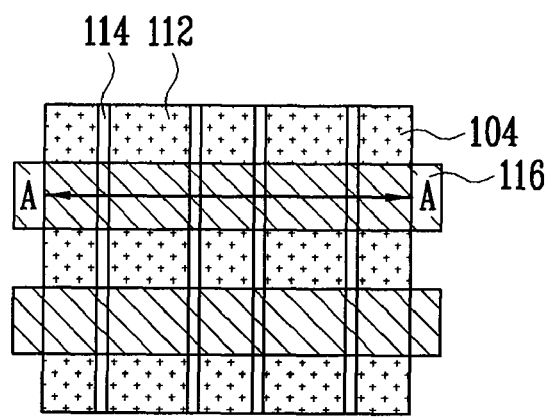
Figure 3D:
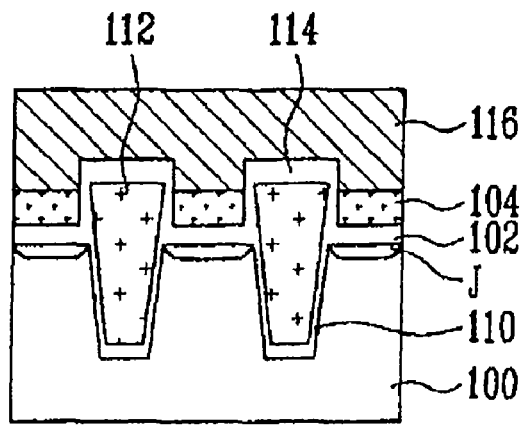

FIG. 3D is a cross-sectional view of the flash memory device taken along line A-A in FIG. 2D. Referring to FIGS. 2D and 3D, the nitride film 106 is stripped. A conductive film for control gates is deposited on the entire structure and then patterned to form control gates 116 into a line shape, which crosses the floating gate. The conductive film for the control gates may be formed using either polysilicon, a stack structure of polysilicon and tungsten silicide, a conductive metal film or the like.

Before the conductive film for the control gates is formed, the nitride film and the oxide film may be further formed into a dielectric film composed of oxide film/the nitride film/the oxide film.

Thereafter, the nitride film 106 is stripped to prepare for a subsequent process. A blanket etch back process is then performed to strip the slopes of the second oxide films 114. This enables the distance between sidewall corners of the second oxide films 114 to be secured. The second oxide films 114 may be formed to a height of about 150 Å to about 200 Å.

Figure 2E:
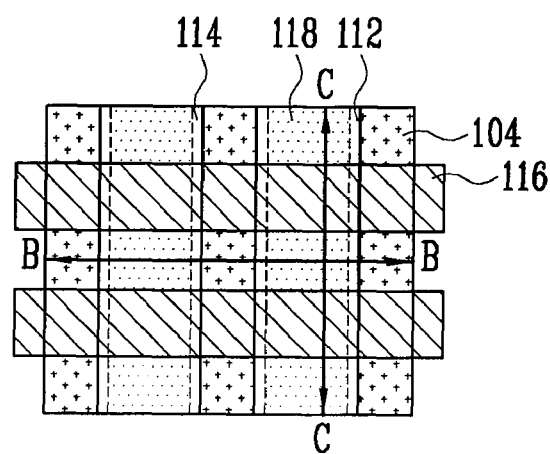
Figure 3E:
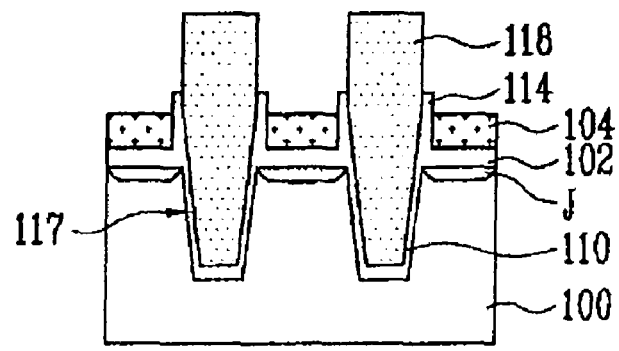

FIG. 3E is a cross-sectional view of the flash memory device taken along line B-B in FIG. 2E. FIG. 3E illustrates the region in which the isolation structures 118 are formed.

Referring to FIGS. 2E and 3E, the second oxide films 114 and the second polysilicon film 112, which are exposed between the control gates 116 after the process of FIG. 3D, are stripped to form second trenches 117. The insides of the second trenches 117 are gap-filled with an insulating film to form isolation structures 118. The insulating film may be filled into the second trenches 117 using a HDP oxide film. The isolation structures 118 may be formed to the same height as that of the control gates 116.

Figure 3F:
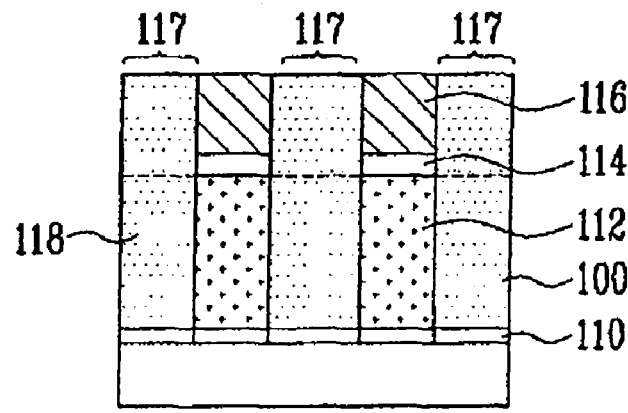

FIG. 3F is a cross-sectional view of the flash memory device taken along line C-C in FIG. 2E.

As shown in FIG. 3F, in the present embodiment, the sidewall oxide films 110 and the first polysilicon film 112 for the floating gates are deposited within the first trenches 108 to form the floating gates. The first polysilicon film 112 exposed between the control gates 116 are stripped to form the second trenches 117. The insides of the second trenches 117 are filled with the insulating film to form the isolation structures 118, thereby completing a flash memory device.

Accordingly, electrons are moved through the sidewall oxide films 110 formed within the first trenches 108 in order to store information. The amount of electrons moved through the sidewalls decides the threshold voltage of the cell. The amount of electrons that flow along the interface of the sidewall oxide films 110 is controlled using threshold voltage, which is controlled as described above; this can then determine whether information has been stored in a cell. Furthermore, the interference phenomenon between the floating gates can be avoided.

FIGS. 4A to 4D are layout diagrams illustrating a flash memory device to which a general STI is applied according to a second embodiment of the present invention. FIGS. 5A to 5E are cross-sectional views of the flash memory devices corresponding to the layout diagrams of FIGS. 4A to 4D, respectively.

Figure 4A:
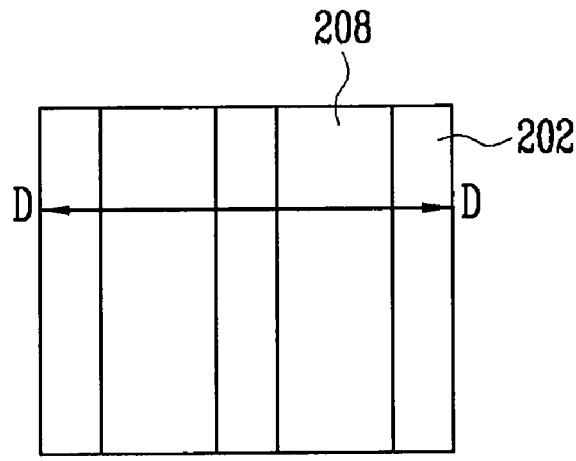
FIGS. 4A to 4D are layout diagrams illustrating a flash memory device to which a general STI is applied according to a second embodiment of the present invention.
Figure 5A:
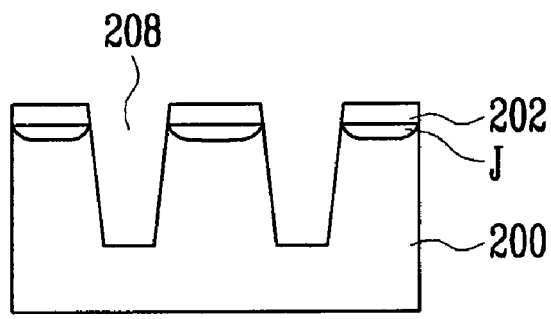
FIGS. 5A to 5E are cross-sectional views of the flash memory devices corresponding to the layout diagrams of FIGS. 4A to 4D, respectively.

FIG. 5A is a cross-sectional view of the flash memory device taken along line D-D in FIG. 4A.

Referring to FIGS. 4A and 5A, a high concentration ion implantation process is performed to form junction units J on a semiconductor substrate 200. A first oxide film 202 is thickly formed on the semiconductor substrate 200. Since the ion of a high concentration has been injected into the semiconductor substrate 200, the first oxide film 202 can be formed thickly even using a low thermal process. The first oxide film 202 may be formed to a thickness of about 300 Å to about 500 Å.

The first oxide film 202 and the semiconductor substrate 200 are selectively etched by photolithography and etch processes using an isolation mask, forming a plurality of first trenches 208.

Figure 4B:
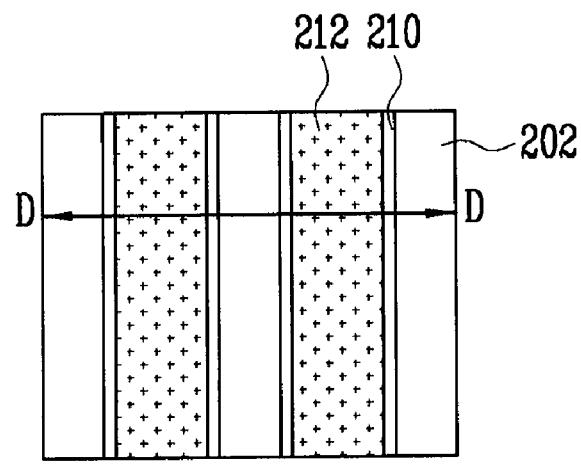
Figure 5B:
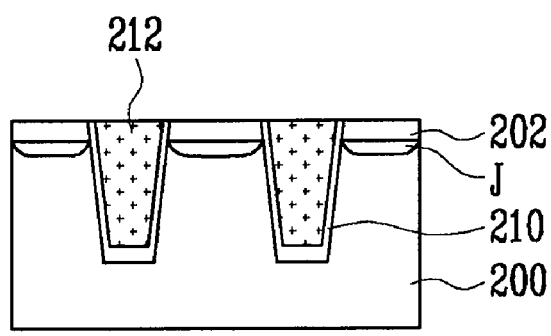

FIG. 5B is a cross-sectional view of the flash memory device taken along line D-D in FIG. 4B.

Referring to FIGS. 4B and 5B, an ion implantation process for controlling the threshold voltage (Vt) is performed on the sidewalls of the first trenches 208. Since the junction units J are formed at both sides of the first trenches 208, electrons are moved along the sidewalls of the first trenches 208. Accordingly, the sidewalls of the first trenches 208 become the channel region of the device and the channel length can be made longer in comparison with the related art.

However, in the case of a short channel length, cell leakage is increased. To prevent this problem, a greater amount of positive ions are injected. However, this method increases disturb effects and degrades product characteristics. In the present invention, the channel length is very long. Accordingly, cell leakage can be prevented by injecting only a small amount of positive ions. It is therefore possible to minimize the cell threshold voltage (Vt). Furthermore, This also means that disturb effects of the NAND flash memory, which become worse as the channel concentration increases, are improved. Accordingly, product characteristics can be improved.

An oxidation process is then performed to form sidewall oxide films 210 within the first trenches 208. The sidewall oxide films 210 may be formed to a thickness of about 70 Å to 100 Å. When the sidewall oxide films 210 are formed, the first polysilicon film 104 is partially oxidized.

A polysilicon film 212 is formed on the entire structure so that the first trenches 208 are buried. The polysilicon film 212 is polished until the top surface of the first oxide film 202 is exposed, thereby isolating each second polysilicon film 112.

The polishing process may be performed using CMP. By doing so, the second polysilicon films 212 buried within the first trenches 208 serve as floating gates, and the sidewall oxide films 210 serve as tunnel oxide films.

Figure 4C:
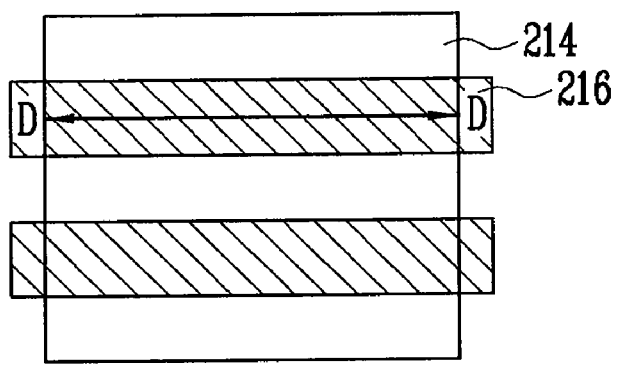
Figure 5C:
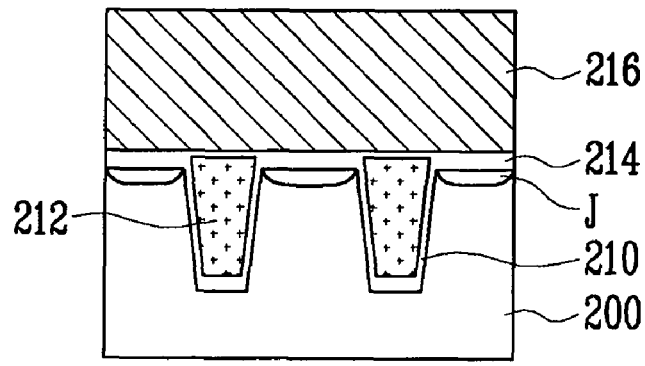

FIG. 5C is a cross-sectional view of the flash memory device taken along line D-D in FIG. 4C.

Referring to FIGS. 4C and 5C, an oxidization process is performed to partially oxidize the top surface of the second polysilicon films 212, forming a second oxide film 214. The second oxide film 214 may be formed to a thickness of about 300 Å to about 500 Å from the top surface of the first oxide film 202.

The second oxide film 214 that has been thickly formed by the oxidization process serves as a dielectric film between the floating gates and control gates to be formed in a subsequent process. Thereafter, a conductive film for a control gate is deposited on the entire structure and is then patterned to form the control gate 216 into a line shape, which crosses the floating gate. The conductive film for the control gate may be formed using either polysilicon, a stack structure of polysilicon and tungsten silicide, a conductive metal film or the like.

Furthermore, before the conductive film for the control gate is formed, the nitride film and the oxide film may be further formed into a dielectric film composed of oxide film/ the nitride film/the oxide film.

Figure 4D:
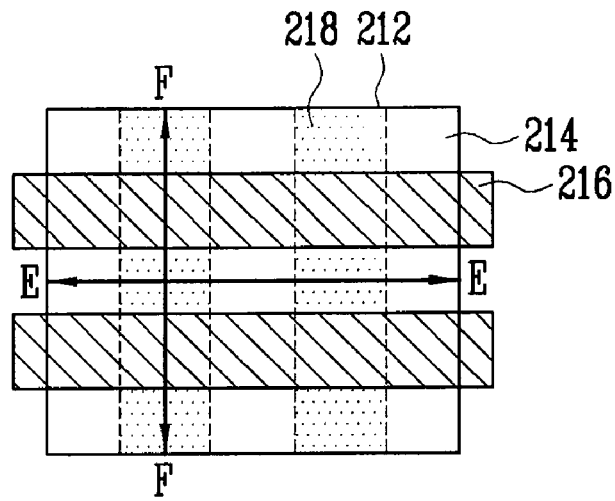
Figure 5D:
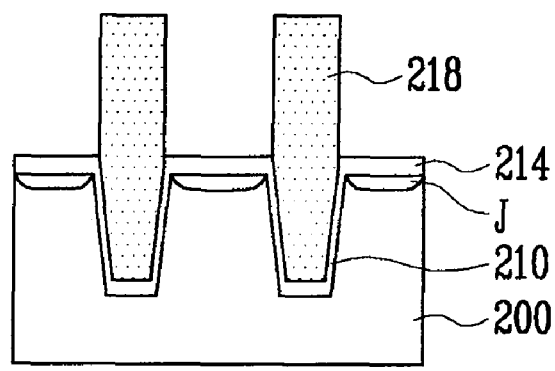

FIG. 5D is a cross-sectional view of the flash memory device taken along line E-E in FIG. 4D and illustrates the region in which the isolation structure 218 is formed.

Referring to FIGS. 4D and 5D, the second oxide films 214 and the second polysilicon film 212, which are exposed between the control gates 216 after the process of FIG. 5C, are stripped to form second trenches. The insides of the second trenches are filled with an insulating film to form isolation structures 218. The insulating film filled into the second trenches may be formed using a HDP oxide film. The isolation structures 218 may be formed to the same height as that of the control gates 216.

Figure 5E:
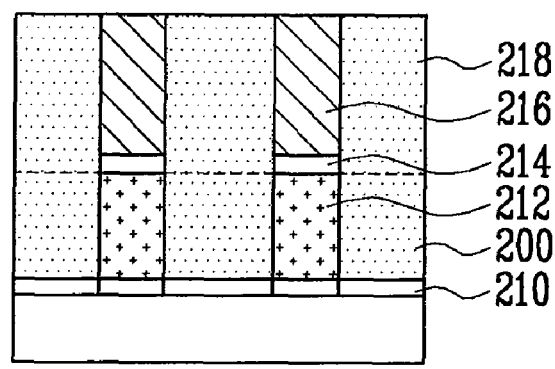

FIG. 5E is a cross-sectional view of the flash memory device taken along line F-F in FIG. 4D.

As shown in FIG. 5E, in the present embodiment, the sidewall oxide films 210 and the first polysilicon film 212 for the floating gates are deposited within the first trenches 208 to form the floating gates. The second oxide films 214 exposed between the control gates 216 are stripped to form the second trenches. The insides of the second trenches are filled with the insulating film to form the isolation structures 218, thereby completing a flash memory device.

Accordingly, electrons are moved through the sidewall oxide films 210 formed within the first trenches 208 in order to store information. The amount of electrons moved through the sidewalls decides the threshold voltage of the cell. The amount of electrons that flow along the interface of the sidewall oxide films 210 is controlled using the threshold voltage, which is controlled as described above; this can then determine whether information has been stored in a cell. Furthermore, the interference between the floating gates can be avoided.

As described above, according to the present invention, the buried floating gates are partially formed within the trenches for forming the isolation structures and are then separated in the isolation structures. It is therefore possible to avoid the interference between the floating gates.

Furthermore, the trenches are gap-filled with the polysilicon film having good step coverage. It is therefore possible to improve the gap-fill ability.

In addition, since the sidewalls of the trenches in which the buried floating gates are formed can be used as the channels of the device, the channel length can be made long. Therefore, cell leakage can be prohibited by injecting only a small amount of positive ions during an ion implantation process for controlling the threshold voltage (Vt). It is therefore possible to minimize the cell threshold voltage (Vt) and to improve disturb effects.

While the invention has been described in connection with the present embodiments, it is to be understood that the invention is not limited to the disclosed embodiments, but, is intended to cover various modifications and equivalent arrangements included within the spirit and scope of the appended claims.

What is claimed is:

1. A flash memory device comprising:
   first and second trenches formed in a semiconductor substrate, wherein the first and second trenches are spaced apart from each other;

at least one junction region formed by an ion implantation process in the semiconductor substrate between the first and second trenches except bottoms of the first and second trenches, the at least one junction region forming at least one of a source region or a drain region;
first and second floating gates formed in the first and second trenches, respectively;
at least one isolation structure formed between the first and second floating gates;
first and second dielectric films provided over the first and second floating gates, respectively; and
first and second control gates formed over the first and second dielectric films, respectively.

2. The flash memory device as claimed in claim 1, further comprising an oxide film formed on sidewalls of the first and second trenches.

3. The flash memory device as claimed in claim 1, wherein the isolation structure has the same height as upper surfaces of the first and second control gates.

4. The flash memory device as claimed in claim 1, wherein each of the first and second dielectric films comprises a stack of an oxide film/a nitride film/an oxide film.

5. The flash memory device as claimed in claim 1, wherein:
the first floating gate is not formed in the second trench; and
the second floating gate is not formed in the first trench.

6. The flash memory device as claimed in claim 1, further comprising a third dielectric film formed over the at least one junction region to separate the at least one junction region from the first and second control gates.

7. The flash memory device as claims in claim 6, wherein the third dielectric film comprises an oxide film.

8. The flash memory device as claims in claim 7, wherein the third dielectric film oxide film is formed to a thickness of about 300Å to about 500Å.

* * * * *